(12) United States Patent
Kuo et al.

(10) Patent No.: US 8,269,940 B2
(45) Date of Patent: Sep. 18, 2012

(54) SENSING STRUCTURE (75) Inventors: Han Ping Kuo, Hsinchu (TW); Cheng Yi Su, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 1048 days.

(21) Appl. No.: 12/141,429

(22) Filed: Jun. 18, 2008

(65) Prior Publication Data

US 2009/0194342 A1    Aug. 6, 2009

(30) Foreign Application Priority Data

Feb. 4, 2008  (TW) ............................... 97104180 A (51) Int. Cl.
*G02F 1/1345*    (2006.01)
*G02F 1/1335*    (2006.01)

(52) U.S. Cl. ......................................... 349/150; 349/12

(58) Field of Classification Search .................... 349/12, 349/150, 151, 96, 138, 139; 178/18.03
See application file for complete search history.

(56) References Cited

U.S. PATENT DOCUMENTS

| | | | |
|---|---|---|---|
| 6,507,384 B1 | 1/2003 | Endo et al. | |
| 6,876,355 B1 * | 4/2005 | Ahn et al. | 345/173 |
| 7,084,933 B2 * | 8/2006 | Oh et al. | 349/12 |
| 7,259,823 B2 | 8/2007 | Wu et al. | |
| 7,453,700 B2 * | 11/2008 | Miyata | 361/749 |
| 7,755,612 B2 * | 7/2010 | Park et al. | 345/173 |
| 7,956,939 B2 * | 6/2011 | Kubota et al. | 349/12 |
| 2005/0099402 A1 | 5/2005 | Nakanishi et al. | |
| 2006/0238516 A1 | 10/2006 | Kai | |

FOREIGN PATENT DOCUMENTS

| | | |
|---|---|---|
| CN | 1122866 | 10/2003 |
| CN | 1614624 | 5/2005 |
| CN | 1693943 A | 11/2005 |
| CN | 1282893 | 11/2006 |
| JP | 2005-292389 | 10/2005 |
| TW | 200529134 A | 9/2005 |

OTHER PUBLICATIONS

Chinese language office action dated Jun. 5, 2009.
English language translation of abstract of CN 1282893.
Chinese language office action dated Jun. 9, 2010.
English language translation of Chinese language office action.
English language translation of abstract of JP 2005-292389 (published Oct. 20, 2005).
English language translation of abstract of TW 96138186.
English translation of abstract of CN 1693943 A.
English translation of pertinent contents of China Office Action mailed Dec. 27, 2010.
China Office Action mailed Dec. 27, 2010.
Taiwan Office Action mailed Jun. 18, 2012.

* cited by examiner

*Primary Examiner* — Thoi Duong (74) *Attorney, Agent, or Firm* — Thomas, Kayden, Horstemeyer & Risley, LLP (57) ABSTRACT

A sensing structure is provided. The sensing structure includes a first substrate, a second substrate, a sensing unit, and a flexible printed circuit (FPC). The sensing unit is disposed on the first substrate and adapted to generate a signal when the sensing unit is touched. The FPC has a first end and a second end. The first end includes a first connecting portion and a second connecting portion. The first connecting portion is disposed on the first substrate and electrically connected to the sensing unit, and the second connecting portion connects to the second substrate.

22 Claims, 7 Drawing Sheets

SENSING STRUCTURE

This application claims the benefit from the priority of Taiwan Patent Application No. 097104180, filed Feb. 4, 2008, the disclosure of which is incorporated herein by reference in its entirety.

CROSS-REFERENCES TO RELATED APPLICATIONS

Not applicable.

BACKGROUND OF THE INVENTION

1. Field of the Invention

The present invention relates to a sensing structure, and more particularly, to a sensing structure for a display.

2. Descriptions of the Related Art

The advancement of electro-optical technologies and the digitalization of image technologies have made displays widespread in daily life. Among these displays, liquid crystal displays (LCDs) are widely used in various communication and electronic products due to their advantages such as high definition, light weight, thin profile, low power consumption, and low radiation. As mainstream products in the display market, LCDs have replaced conventional cathode ray tube (CRT) displays gradually.

LCDs with sensing units have a touch sensing function. Therefore, it is not necessary to reserve some space for keyboards or other functional buttons in electronic products. A larger display panel can be accommodated within electronic products of the same size.

Figure 1:
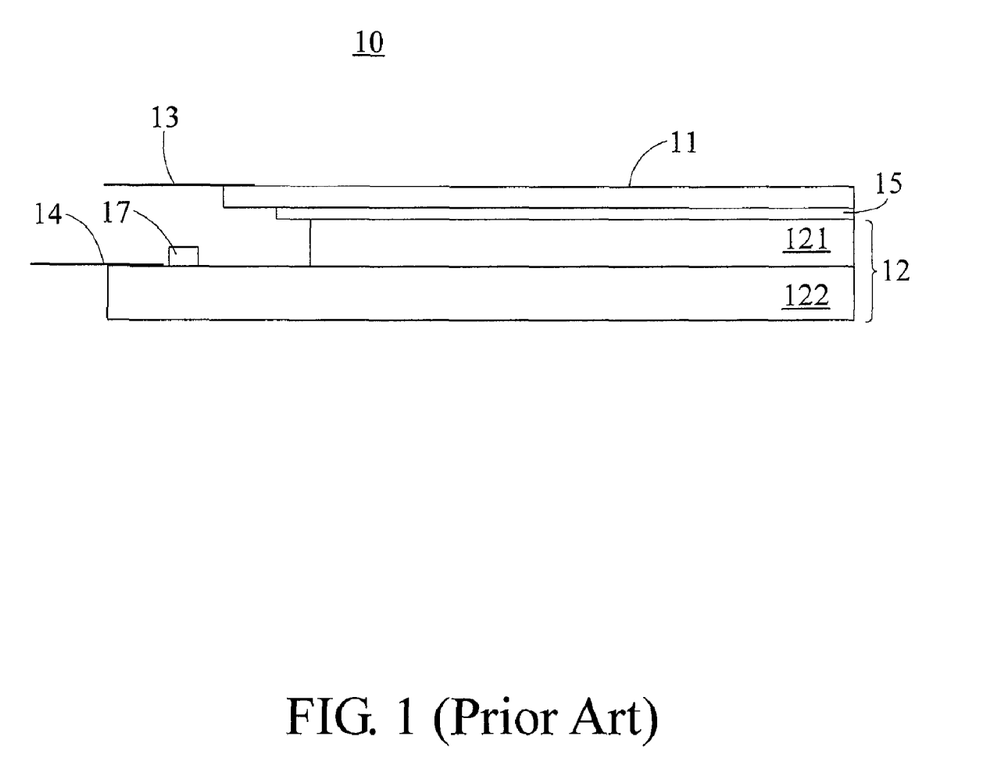
FIG. 1 is a side view of the conventional sensing structure.

FIG. 1 depicts a conventional sensing structure. The conventional sensing structure 10 comprises a touch panel 11 and an LCD panel 12. The touch panel 11 is disposed on the LCD panel 12. A first flexible printed circuit (FPC) 13 disposed on the touch panel 11 is used to transmit a sensing signal generated when the touch panel 11 is touched. The LCD panel 12 comprises a color filter (CF) substrate 121 and a thin-film transistor (TFT) array substrate 122. A second FPC 14 and a driving chip 17 are disposed on the TFT array substrate 122 to supply a driving voltage required for the operation of the LCD panel 12. Furthermore, the LCD panel 12 can function as a independent displaying device. The touch panel 11 can be adhered onto the LCD panel 12 by an adhesive 15.

The first FPC 13 and the second FPC 14 are finally integrated into a connector (not shown) by heat bonding, and the connector is electrically connected to the signal processing system (not shown).

Although an LCD with a touch panel has touch sensing function, at least two FPCs are required in an LCD with a touch panel to separately transmit the sensing signal and the driving signal. Then the required materials of FPC and heat bonding frequencies are raised. Therefore, manufacturing costs and the complexity of manufacturing processes increases.

In view of this, it is highly desirable in the art to provide a sensing structure with a simpler process and a lower cost.

SUMMARY OF THE INVENTION

One objective of this invention is to provide a sensing structure. By a flexible printed circuit (FPC), this sensing structure can reduce the usage of materials and has simplified processes for heat bonding of the FPCs. Therefore the manufacturing costs can be decreased. If a touch unit is integrated with a display, the thickness of the display with a touch unit will not be increased.

The sensing structure comprises a first substrate, a second substrate, a sensing unit, and a flexible printed circuit. The second substrate is disposed under the first substrate. The sensing unit is disposed on the first substrate and is adapted to generate a sensing signal when being touched. The flexible printed circuit has a first end and a second end. The first end includes a first connecting portion and a second connecting portion. The first connecting portion is disposed on the first substrate and electrically connects to the sensing unit, and the second connecting portion connects to the second substrate.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

This invention will now be explained with reference to several embodiments thereof. However, these embodiments are not intended to limit this invention to any specific context, applications or with any particular methods described in these embodiments. Therefore, the description of these embodiments is only intended to illustrate rather than to limit this invention.

Figure 2:
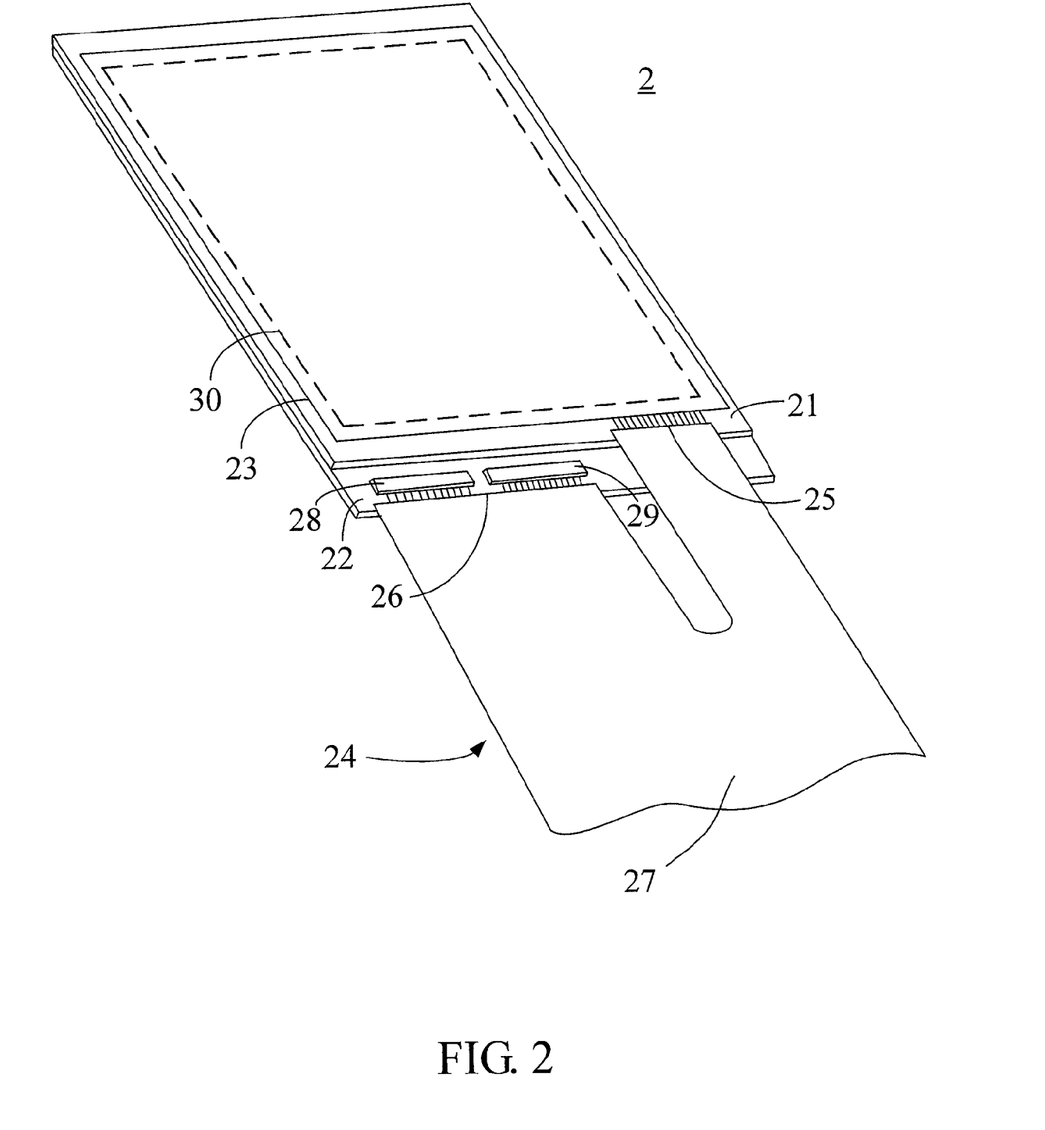
FIG. 2 is a 3D sketch of the first embodiment of a sensing structure of this invention.
Figure 3:
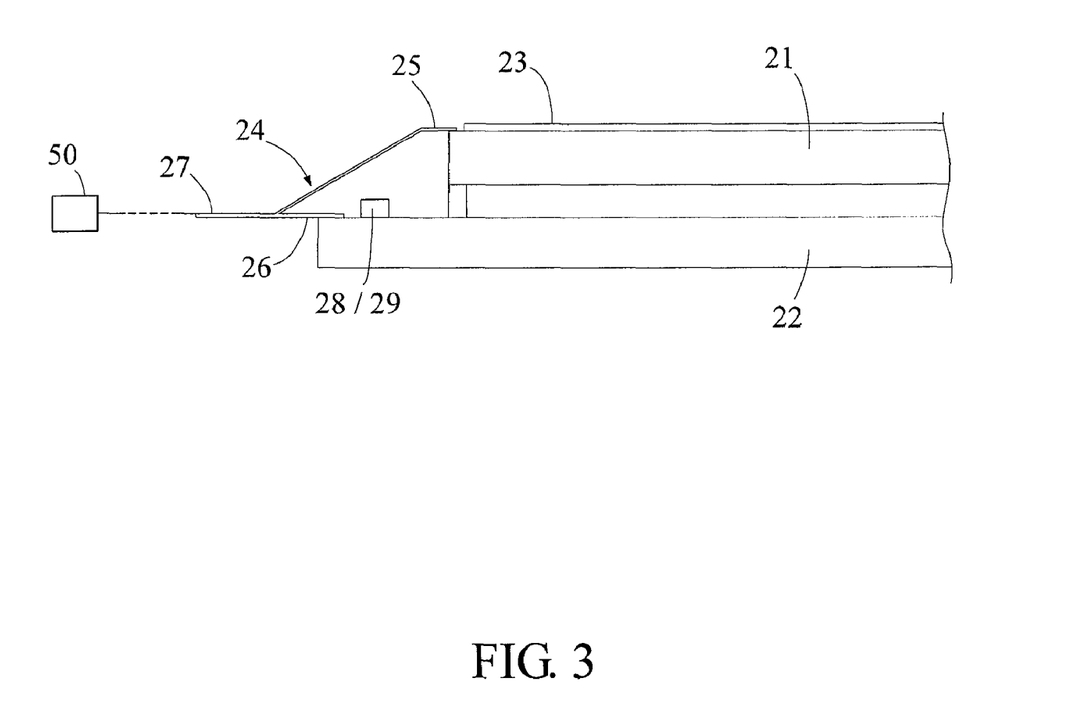
FIG. 3 is a side view of the sensing structure depicted in FIG. 2.

As shown in FIGS. 2 and 3, a 3-D sketch and a side view of the first preferred embodiment of a sensing structure are depicted therein respectively. A sensing structure 2 comprises a first substrate 21, a second substrate 22, a sensing unit 23, and a flexible printed circuit (FPC) 24.

The second substrate 22 is disposed beneath the first substrate 21. The first substrate 21 may be a color filter (CF) substrate, and the second substrate 22 may be a thin-film transistor (TFT) array substrate. An LCD panel is composed of a first substrate 21 and a second substrate 22. Furthermore, the sensing unit 23 is disposed on the first substrate 21 and covers at least part of an active area 30 of the sensing structure 2. The sensing unit 23 is adapted to generate a sensing signal when being touched.

In this embodiment, a sensing chip 28 and a driving chip 29 are disposed on the second substrate 22, and the sensing chip 28 and the driving chip 29 are electrically connected with the FPC 24 respectively. In more detail, the FPC 24 has a first end and a second end. The FPC 24 has a first connecting portion 25 and a second connecting portion 26 at the first end. The first connecting portion 25 is disposed on the first substrate 21 and electrically connects to the sensing unit 23. The second connecting portion 26 may electrically connect to the sensing chip 28 and the driving chip 29.

The electrical connection of the first connecting portion 25 and the sensing unit 23 may be in the following manners. For example, the first connecting portion 25 may have a circuit connecting to the circuit of the first substrate 21. Through the circuit of the first substrate 21, the circuit of the first connecting portion 25 electrically connects to the circuit of the sensing unit 23. Alternatively, without the circuit of the first substrate 21 between the first connecting portion 25 and the sensing unit 23, the first connecting portion 25 may have a circuit directly connected to the circuit of the sensing unit 23. These electrically connecting manners are only provided for illustration rather than to limit this invention, and those skilled in the art may adjust the connecting manner of the invention depending on the practical requirements.

The second connecting portion 26 may connect to the second substrate 22, and the second connecting portion 26 electrically connects to the sensing chip 28 and the driving chip 29 via the corresponding circuits respectively. The dimensions, numbers, and locations of the sensing chip 28 and the driving chip 29 are provided for illustration, and those skilled in the art may make adjustments depending on the practical requirements. Additionally, at the second end, the FPC 24 may further have a third connecting portion 27 which electrically connects to a signal processing system 50.

The sensing chip 28 on the second substrate 22 electrically connects to the sensing unit 23 through the second connecting portion 26 and the first connecting portion 25. Hence, through the first connecting portion 25 and the second connecting portion 26 of the FPC 24, a sensing signal generated by the sensing unit 23 may be transmitted to the sensing chip 28 for processing information. Then, the signal from the sensing chip 28 may be transmitted to the signal processing system 50 through the second connecting portion 26 and the third connecting portion 27. The signal processing system 50 can receive and process signals and then identify the control instruction from a user. In some embodiments, the signal processing system 50 may respond to signals made from the user. For driving the LCD panel to display a frame, the signal processing system 50 may transmit a driving signal into the driving chip 29 via the second connecting portion 26 and the third connecting portion 27. Additionally, for the facileness of heat bonding and for the precision of circuit alignment, a slit may be formed between the first connecting portion 25 and the second connecting portion 26 to improve the heat bonding and circuit alignment. The location, length, width or number of the slit is not limited to the above description. Those skilled in the art may make an adjustment depending on the practical requirements. Furthermore, the FPC 24 may have a preset circuit layout so that the third connecting portion 27 is not required to be heat-bonded. Therefore, the cost and the complexity of the manufacturing process can be reduced.

Figure 4:
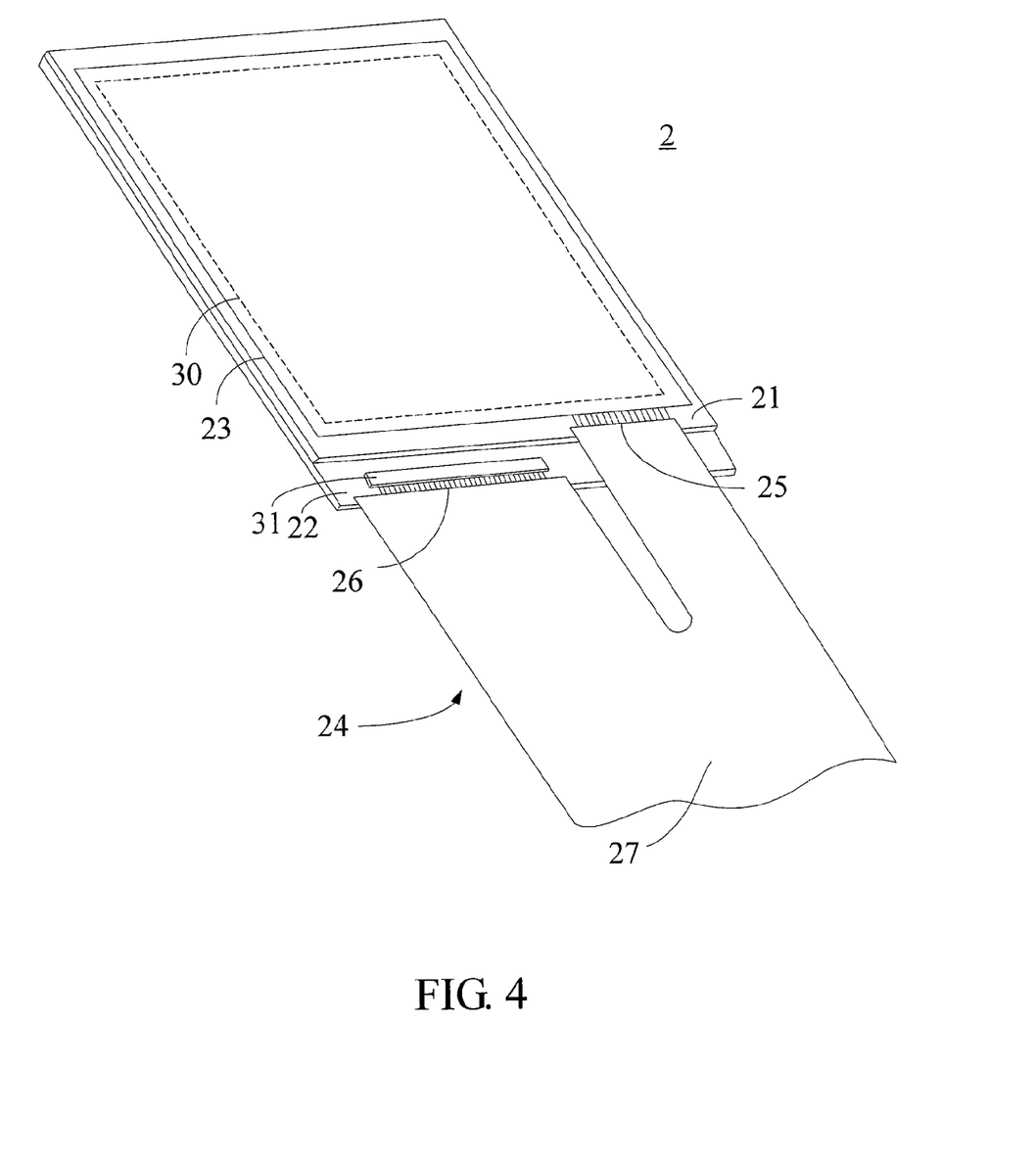
FIG. 4 is a perspective view of the second embodiment of the sensing structure of this invention.

FIG. 4 depicts the second embodiment of the sensing structure of this invention. In this embodiment, the sensing chip may be omitted and the driving chip 31 may be retained. In this case, through the first connecting portion 25 and the third connecting portion 27 of the FPC 24, the sensing signal from the sensing unit 23 is transmitted to the signal processing system (not shown) for processing information. Moreover, the sensing chip and the driving chip may be integrated in the embodiment. The driving chip 31 with a sensing function may be used. In other words, through the first connecting portion 25 and the second connecting portion 26, the sensing signal generated by the sensing unit 23 may be transmitted to the driving chip 31 for processing information. And then the signal from the driving chip 31 is transmitted to the signal processing system (not shown) through the second connecting portion 26 and the third connecting portion 27. In this embodiment, a chip with driving and sensing functions is used to receive and process the sensing signal from the sensing unit 23, and supply a driving voltage to drive the LCD panel. The dimension, number and location of the driving chip 31 is provided for illustration, and those skilled in the art may make adjustments depending on the practical requirements.

Figure 5:
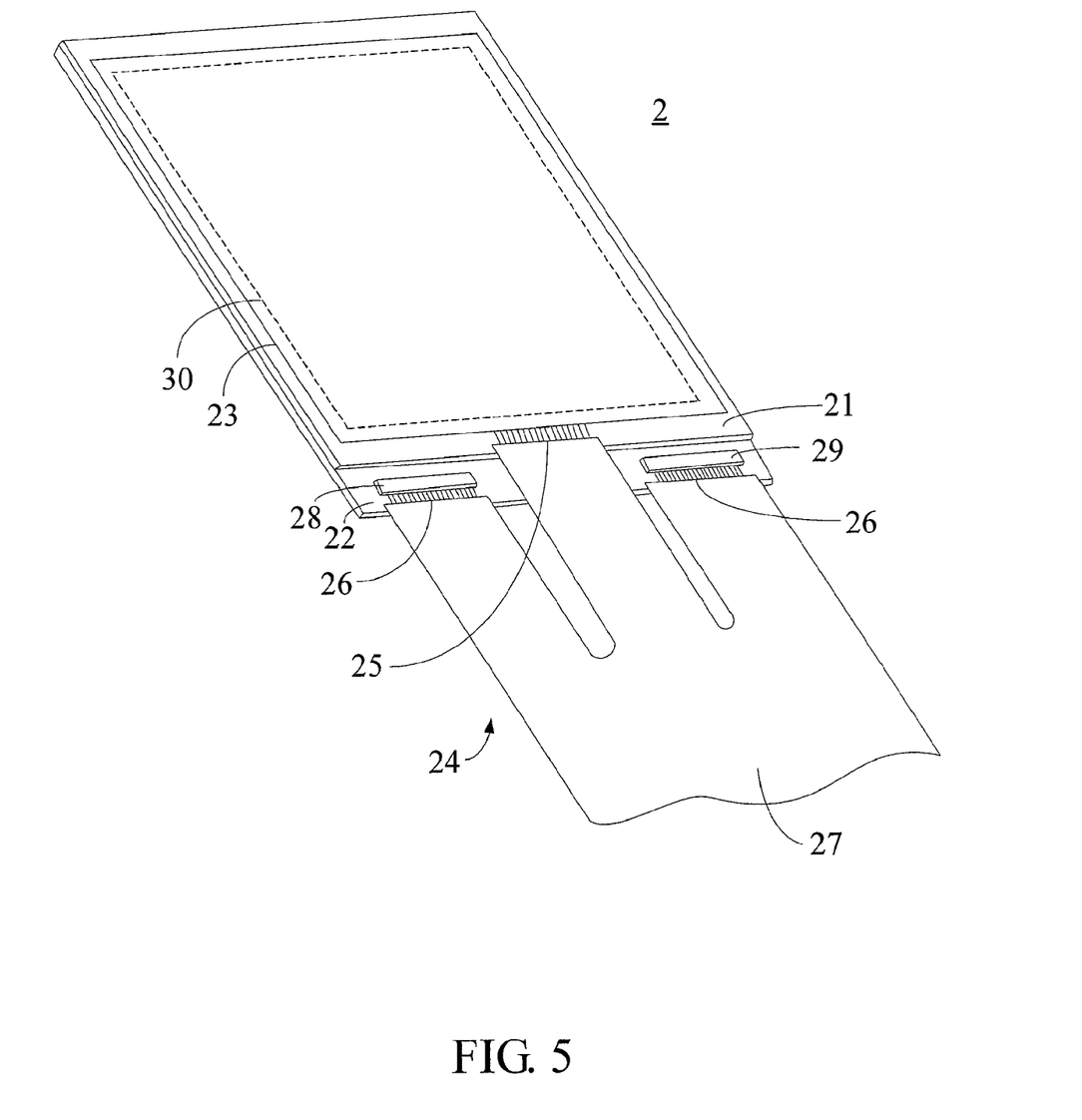
FIG. 5 is a perspective view of the third embodiment of the sensing structure of this invention.

FIG. 5 depicts the third embodiment of the sensing structure of this invention. In this embodiment, the sensing unit 23, the sensing chip 28 and the driving chip 29 electrically connect to the FPC 24 respectively, and a first connecting portion 25 is between two separate second connecting portions 26. In more detail, at the first end, the FPC 24 has one first connecting portion 25 electrically connecting to the sensing unit 23 and two separate second connecting portions 26 connecting to the second substrate 22. As depicted in FIG. 5, the two separate second connecting portions 26 are disposed corresponding to the sensing chip 28 and the driving chip 29 respectively. The two separate second connecting portions 26 connect with different locations of the second substrate 22 respectively, and the first connecting portion 25 is located between the two separate second connecting portions 26. Similarly, for the facileness of heat bonding and for the precision of circuit alignment, slits may be formed between the first connecting portion 25 and the two separate second connecting portions 26 to improve the heat bonding and circuit alignment. There is no limitation for locations, lengths, widths or numbers of slits. Those skilled in the art may make an adjustment depending on the practical requirements. The FPC 24 may have a second end electrically connecting to the signal processing system (not shown) through the third connecting portion 27. Likewise, the dimensions, locations and numbers of various chips depicted in FIG. 5 are provided for illustration. Those skilled in the art may make an adjustment depending on the practical requirements. Additionally, the dimensional difference, distribution locations and numbers of the first connecting portion 25 and the second connecting portion 26 are for illustration. Those skilled in the art may make an adjustment depending on the practical requirements.

Figure 6:
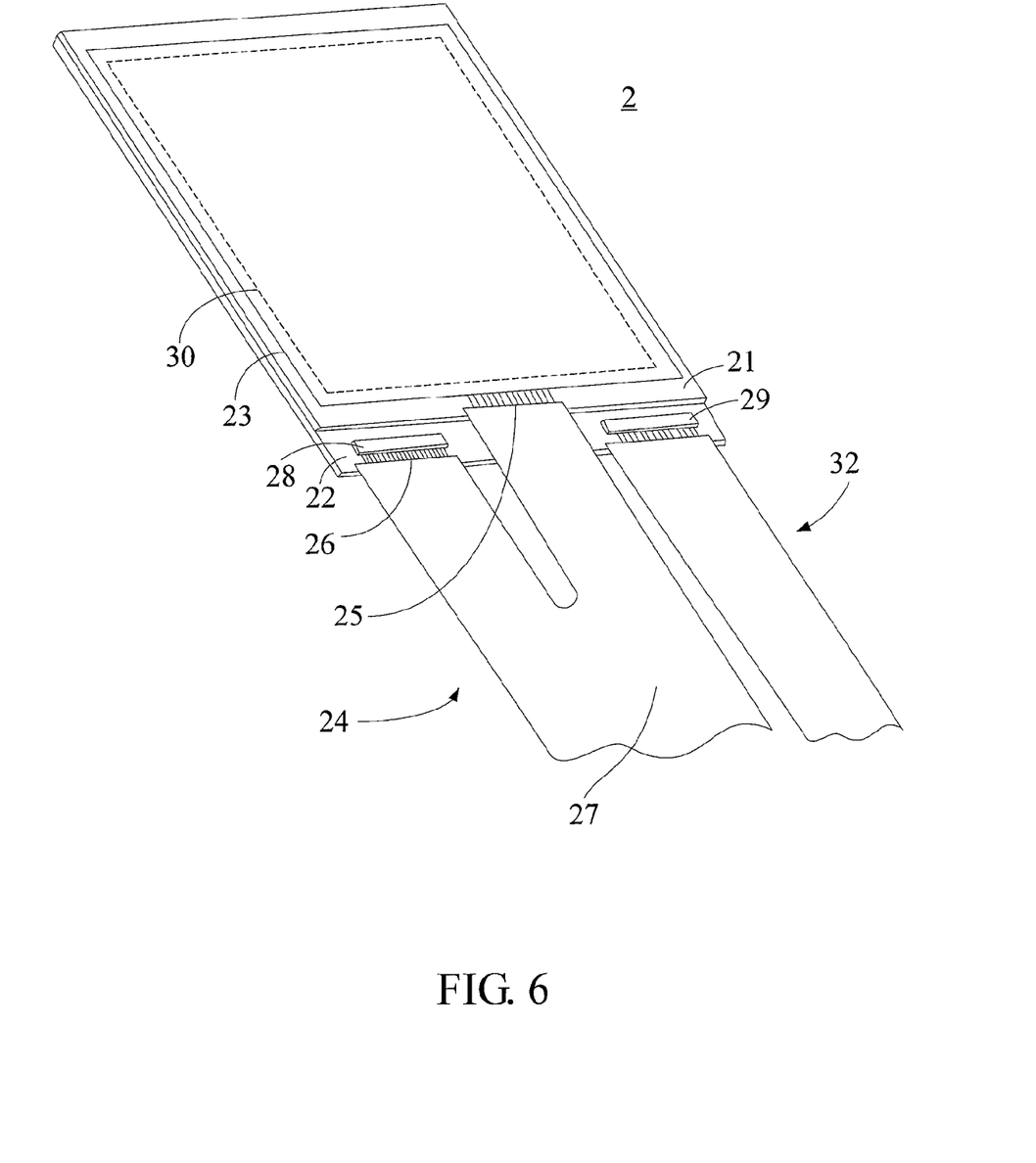
FIG. 6 is a perspective view of the fourth embodiment of the sensing structure of this invention.

FIG. 6 depicts the fourth embodiment of the sensing structure of this invention. In this embodiment, the sensing chip 28 and the driving chip 29 may be separately disposed on different locations of the second substrate 22. The FPC 24 electrically connects to the sensing unit 23, the sensing chip 28, and the signal processing system (not shown). The driving chip 29 electrically connects with another FPC 32 for independently transmitting the driving signal from the signal processing system. The location of the first connecting portion 25 may be changed. For example, the sensing chip 28 and the driving chip 29 are disposed adjacent to each other, and the first connecting portion 25 is disposed on the different location of the first substrate 21. However, the above description is for illustration, and those skilled in the art may make an adjustment depending on the practical requirements. Likewise, the dimensions, locations and numbers of chips are not limited. Those skilled in the art may make an adjustment depending on the practical requirements.

In the aforementioned embodiments, the sensing unit 23 may be a capacitance sensing unit or a resistance sensing unit, but this invention is not limited to above description. The sensing unit 23 may be a touch panel, touch sensing modules, or a touch unit integrated with a display, but this invention is not limited thereto to above description. Those skilled in the art may also choose other appropriate sensing units depending on the practical requirements. Without an additional touch panel, a touch unit integrated with a display is directly combined the touching function in the manufacturing process of the display. Therefore, the total thickness of the display with an integrated touch unit substantially maintains the thickness of the original display. In a preferred embodiment, the sensing unit 23 is a touch unit integrated with a display to reduce the total thickness, weight, number of used elements, and manufacturing cost.

Figure 7:
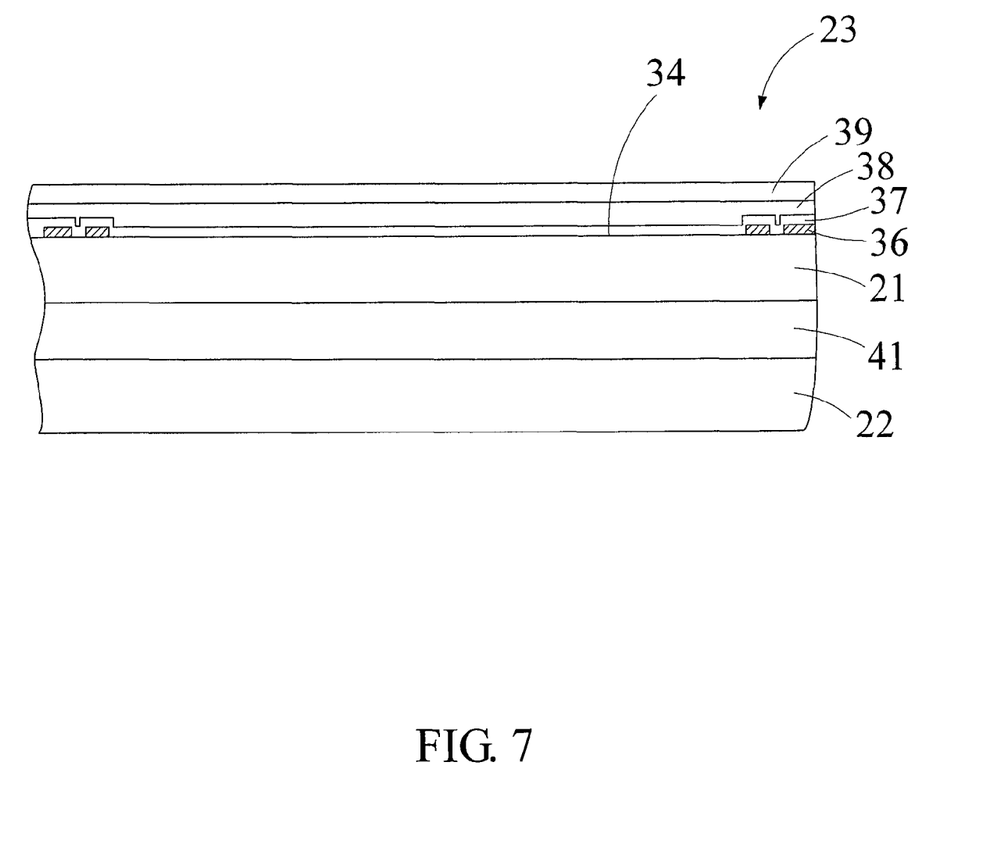
FIG. 7 is a schematic view of the sensing unit of this invention.

FIG. 7 depicts one kind of touch unit integrated with a display. As shown in FIG. 7, a liquid crystal layer 41 is interposed between the first substrate 21 and the second substrate 22. The sensing unit 23 is directly integrated onto the upper surface 34 of the first substrate 21. For example, a patterned electrode layer 36 is formed around the border of the upper surface 34 of the first substrate 21, followed by the formation of a conductive layer 37. The conductive layer 37 may be made of a transparent conductive oxides, such as indium tin oxide (ITO), indium oxide, silicon indium oxide, aluminum zinc oxide (AZO), indium zinc oxide (IZO), antimony tin oxide (ATO) or tin oxide. However, these materials are provided for illustration but not to limit this invention, and those skilled in the art may choose other appropriate materials depending on the practical requirements. In a preferred embodiment, the conductive layer 37 is made of ITO.

A passivation layer 38 may be formed to cover the surface of the conductive layer 37. The passivation layer 38 may be made of silicon nitrides (SiNx). However, this invention is not limited to the above description, and those skilled in the art may choose other appropriate materials depending on the practical requirements. Furthermore, a polarizer 39 may be attached on the passivation layer 38. In some embodiments, the passivation layer 38 may be replaced by the polarizer 39. The touch unit integrated with a display described here is provided for illustration but not to limit this invention. Those skilled in the art may make modifications depending on the practical requirements.

By directly integrated the sensing unit 23 into the upper surface 34 of the first substrate 21, the sensing structure of this invention has more flexible and simpler manufacturing process. Furthermore, compared with prior art, the sensing unit 23 has a thinner thickness that the total thickness of the sensing structure 2 can be decreased.

In conclusion, this invention reduces the usage of the materials and number of heat bonding by FPC(s) to electrically connect the sensing unit, the chips and the signal processing system. Moreover, if the touch unit is integrated with a display, the total thickness of the display may be further decreased, and a final product has light weight and miniaturized volume.

The above disclosure is related to the detailed technical contents and inventive features thereof. Persons having ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A sensing structure, comprising:
a first substrate;
a second substrate disposed under the first substrate;
a sensing unit disposed on the first substrate and adapted to generate a sensing signal when the sensing unit is touched; and
a flexible printed circuit having a first end and a second end, the first end including a first connecting portion and a second connecting portion laterally separated at the first end, wherein the first connecting portion is disposed on the first substrate and electrically connects to the sensing unit, and the second connecting portion connects to the second substrate.

2. The sensing structure as claimed in claim 1, wherein the second end of the flexible printed circuit has a third connecting portion electrically connecting to a signal processing system.

3. The sensing structure as claimed in claim 2, wherein the sensing signal is transmitted to the signal processing system through the first connecting portion and the third connecting portion.

4. The sensing structure as claimed in claim 2, further comprising a sensing chip disposed on the second substrate and electrically connected to the sensing unit through the second connecting portion and the first connecting portion.

5. The sensing structures as claimed in claim 4, wherein the sensing chip is electrically connected to the signal processing system through the second connecting portion and the third connecting portion.

6. The sensing structure as claimed in claim 4, wherein the sensing signal is transmitted to the sensing chip through the first connecting portion and the second connecting portion.

7. The sensing structure as claimed in claim 2, further comprising a driving chip disposed on the second substrate and electrically connected to the signal processing system through the second connecting portion and the third connecting portion.

8. The sensing structure as claimed in claim 7, wherein the sensing signal is transmitted to the driving chip through the first connecting portion and the second connecting portion.

9. The sensing structure as claimed in claim 7, wherein a driving signal from the signal processing system is transmitted to the driving chip through the third connecting portion and the second connecting portion.

10. The sensing structure as claimed in claim 1, wherein the sensing structure has an active area, and the sensing unit covers at least part of the active area.

11. The sensing structure as claimed in claim 1, further comprising another second connecting portion, wherein the first connecting portion is located between the second connecting portion and the another second connecting portion.

12. The sensing structure as claimed in claim 1, wherein the sensing unit is a touch unit integrated with a display.

13. The sensing structure as claimed in claim 1, wherein the sensing unit is integrated onto an upper surface of the first substrate.

14. The sensing structure as claimed in claim 13, wherein the sensing unit comprises a conductive layer which is formed on the upper surface of the first substrate.

15. The sensing structure as claimed in claim 14, wherein the conductive layer is made of indium tin oxide.

16. The sensing structure as claimed in claim 14, wherein the sensing unit includes a passivation layer overlaying the conductive layer.

17. The sensing structure as claimed in claim 16, wherein the passivation layer is made of silicon nitride.

18. The sensing structure as claimed in claim 16, wherein the passivation layer comprises a polarizer.

19. The sensing structure as claimed in claim 1, wherein the sensing unit comprises a touch panel.

20. The sensing structure as claimed in claim 1, wherein the sensing unit comprises a capacitance sensing unit or a resistance sensing unit.

21. The sensing structure as claimed in claim 1, wherein the first end is formed with a slit between the first connecting portion and the second connecting portion.

22. A sensing structure, comprising:
- a first substrate;
- a second substrate disposed under the first substrate;
- a sensing unit disposed on the first substrate and adapted to generate a sensing signal when the sensing unit is touched; and
- a flexible printed circuit having a first end and a second end, the first end including a first connecting portion and a second connecting portion being abreast arranged at the first end to extend from the first end respectively, wherein the first connecting portion is disposed on the first substrate and electrically connects to the sensing unit, and the second connecting portion connects to the second substrate.

* * * * *